(12) United States Patent
Sakamoto

(10) Patent No.: US 6,563,194 B1
(45) Date of Patent: May 13, 2003

(54) BJT WITH SURFACE RESISTOR CONNECTION

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/666,848

(22) Filed: Sep. 21, 2000

(30) Foreign Application Priority Data

Sep. 21, 1999 (JP) .............................. 11-267677

(51) Int. Cl.[7] .................... H01L 27/082; H01L 27/102; H01L 29/70; H01L 31/11
(52) U.S. Cl. ..................... 257/577; 438/328; 438/330
(58) Field of Search ................. 257/355, 577, 257/338, 339, 341, 342, 343, 470, 361, 362, 363, 368, 107, 109, 132, 146, 154, 168, 173, 177

(56) References Cited

U.S. PATENT DOCUMENTS 4,489,340 A * 12/1984 Ueda et al. ............... 357/38
4,758,872 A * 7/1988 Hada ........................ 357/43
5,311,042 A * 5/1994 Anceau ..................... 257/173
5,591,992 A * 1/1997 Leach ....................... 257/173
5,675,169 A * 10/1997 Hoshi et al. ............... 257/355
6,015,992 A * 1/2000 Chatterjee et al. ......... 257/350
6,242,763 B1 * 6/2001 Chen et al. ................ 257/107

FOREIGN PATENT DOCUMENTS

JP 405183172 A * 7/1993
JP 405326823 A * 12/1993

* cited by examiner

Primary Examiner—Wael Fahmy
Assistant Examiner—Dana Farahani
(74) Attorney, Agent, or Firm—Rader, Fishman & Grauer PLLC

(57) ABSTRACT

A semiconductor device having: a base area of the first conduction type formed on a semiconductor substrate; an emitter area of the second conduction type formed in the base area; and a collector area of the second conduction type formed as joined to the base area. In the collector area, an impurity area of the first conduction type is formed as separated from the base area. A surface resistor is connected to a base electrode connected to the base area. The surface resistor is connected, at other position thereof, to the impurity area.

10 Claims, 5 Drawing Sheets

US 6,563,194 B1

BJT WITH SURFACE RESISTOR CONNECTION

BACKGROUND OF THE INVENTION

1. Field of the Invention

The present invention relates to a semiconductor device comprising a resistor-incorporating transistor.

2. Description of Related Art

FIG. 5 shows the arrangement of a conventional semiconductor device comprising a resistor-incorporating transistor, suitable for a digital circuit. More specifically, a P-type base area 92 is formed at the surface side of an N-type semiconductor substrate 91, and an N-type emitter area 93 is formed in this P-type base area 92. A base electrode 95 and an emitter electrode 96 are respectively connected to the base area 92 and the emitter area 93. The base electrode 95 and the emitter electrode 96 are formed, in a raised manner, on an insulating film 94 on the N-type semiconductor substrate 91 through respective contact holes 94a, 94b formed in the insulating film 94. A collector electrode (not shown) is bonded to an N+-type area 97 formed at the underside of the N-type semiconductor substrate 91.

A surface resistor 98 made of polysilicon for example is disposed on the insulating film 94. The surface resistor 98 is connected at its one end to the base electrode 95 raised from the insulating film 94. Using aluminium for example, a base pad 99 is formed on the surface of the other end of the surface resistor 98. The uppermost surface of this semiconductor device is covered with a surface protective film 90, and a portion of the surface of the base pad 99 is exposed to the outside through an opening 90a formed in the surface protective film 90.

A base wire (not shown) is bonded to that portion of the base pad 99 which is exposed through the opening 90a. Accordingly, a forward current entered from the base wire is given to the base electrode 95 through the surface resistor 98. The surface resistor 98 disposed on the insulating film 94 is better in resistance precision than a diffused resistor formed in the semiconductor substrate.

However, the arrangement above-mentioned involves the likelihood that when a forward surge voltage is applied across the base and the emitter, an overcurrent flows in the surface resistor 98 to generate heat, causing the same to be burnt. Further, the arrangement above-mentioned involves the likelihood that when a reverse surge voltage is applied across the base and the emitter, a leak current flows from the N-type semiconductor substrate (collector area) 91 to the base pad 99, generating a spot-like breakdown trace in the insulating film 94 under the base pad 99. Thus, the conventional semiconductor device comprising a resistor-incorporating transistor is not always sufficient in breakdown resistibility.

SUMMARY OF THE INVENTION

It is an object of the present invention to provide a semiconductor device having a resistor-incorporating transistor, which is improved in breakdown resistibility, and also to provide a method of producing such a semiconductor device.

According to the present invention, a semiconductor device comprises: a base area of the first conduction type formed on a semiconductor substrate; an emitter area of the second conduction type formed in the base area; a collector area of the second conduction type formed as joined to the base area; an impurity area of the first conduction type formed, as separated from the base area, in the collector area; a base electrode connected to the base area; a surface resistor connected, at a position thereof, to the base electrode; and a base pad connected to the surface resistor at other position thereof and also connected to the impurity area.

In other words, the semiconductor device of the present invention comprises a transistor having: a base area of the first conduction type formed on a semiconductor substrate; an emitter area of the second conduction type formed in the base area; a collector area of the second conduction type formed as joined to the base area; a base electrode connected to the base area; a surface resistor connected, at a position thereof, to the base electrode; and a base pad connected to the surface resistor at other position thereof, the base pad being connected to the collector area, and an impurity area of the first conduction type is formed, as separated from the base area, in the collector area at its portion joined to the base pad.

It is noted that the second conduction type is different from the first conduction type.

According to the arrangement above-mentioned, the collector area and the impurity area form a PN junction, thus forming a parasite Zener diode between the base pad and the collector area. Accordingly, even though a forward surge voltage is applied across the base and the emitter, a forward overcurrent entered into the base pad escapes to the collector area through the parasite Zener diode. This prevents an overcurrent from flowing in the surface resistor. This in turn prevents the surface resistor from being burnt due to the flow of an overcurrent therein, thus improving the breakdown resistibility against the forward surge voltage.

Further, when a reverse surge voltage not less than the breakdown voltage of the parasite Zener diode is applied across the base and the emitter, there occurs a breakdown phenomenon of the parasite Zener diode, causing a leak current to flow to the base pad from the collector area. Accordingly, for example when an insulating film is formed as covering the surface of the collector area, it is possible to prevent this insulating film from being broken and presenting a spot-like breakdown trace. This improves the breakdown resistibility against the reverse surge voltage, too.

Further, the parasite Zener diode is formed in the collector area at its portion connected to the base pad. Thus, there is no possibility of the semiconductor device being increased in size due to the provision of the parasite Zener diode.

These and other features, objects and advantages of the present invention will be more fully apparent from the following detailed description set forth below when taken in conjunction with the accompanying drawings.

BRIEF DESCRIPTION OFF THE DRAWINGS

Figure 4A:
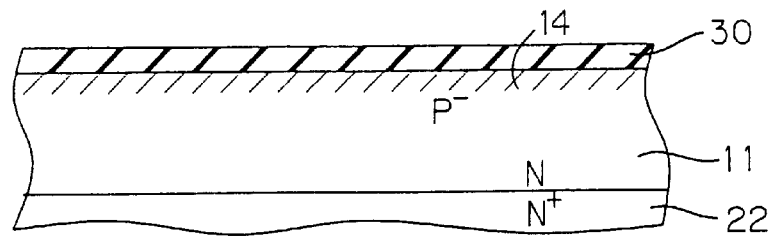
Figure 4B:
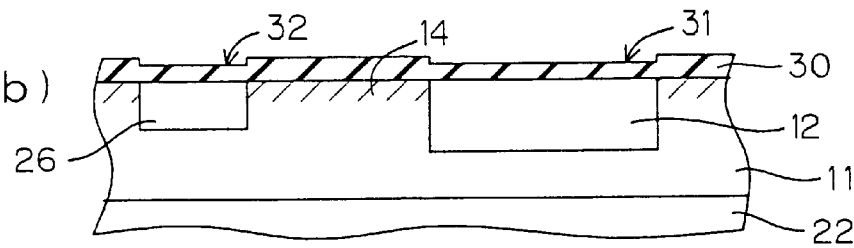
Figure 4C:
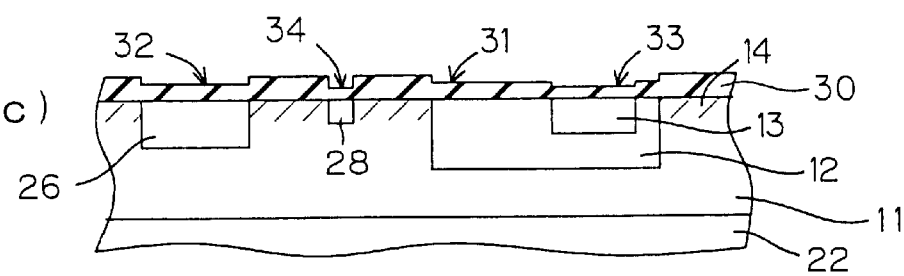
Figure 4D:
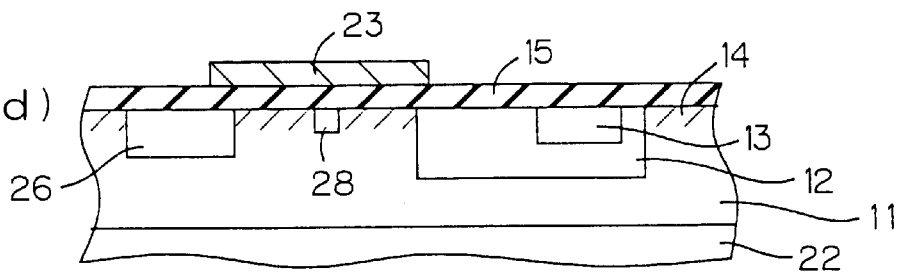
Figure 4E:
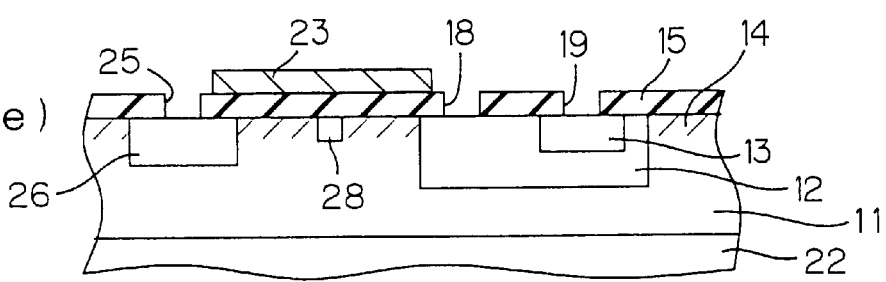
Figure 4F:
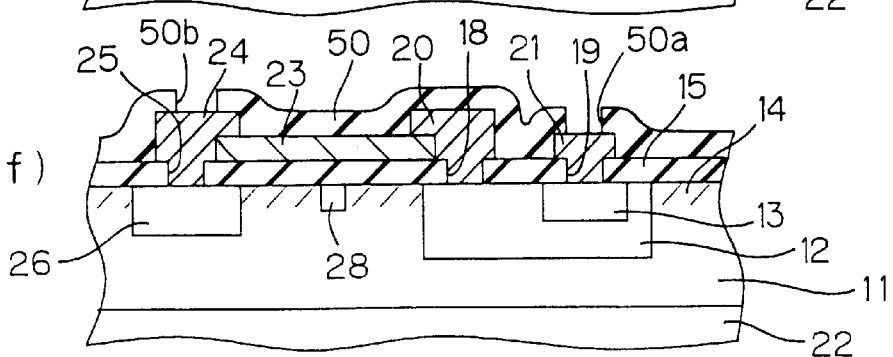
Figure 5:
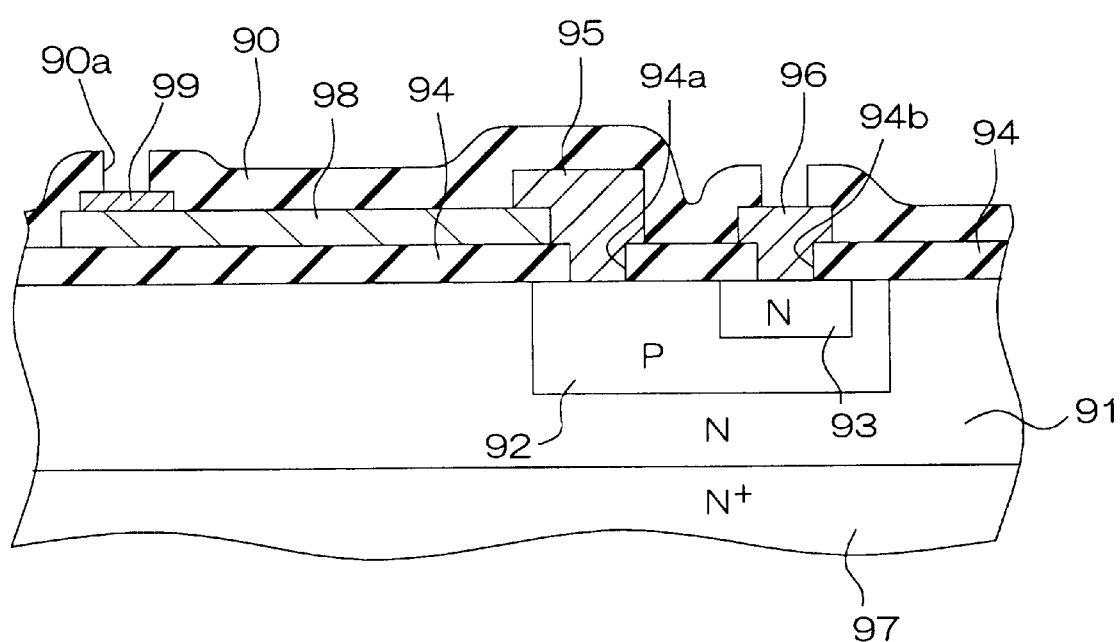

Each of FIG. 4(a) to FIG. 4(f) is a section view illustrating each of the successive steps of a method of producing a semiconductor device having a resistor-incorporating transistor according to the embodiment of the present invention; and FIG. 5 is a section view illustrating the arrangement of a conventional semiconductor device having a resistor-incorporating bipolar transistor.

DESCRIPTION OF THE PREFERRED EMBODIMENTS

Figure 1:
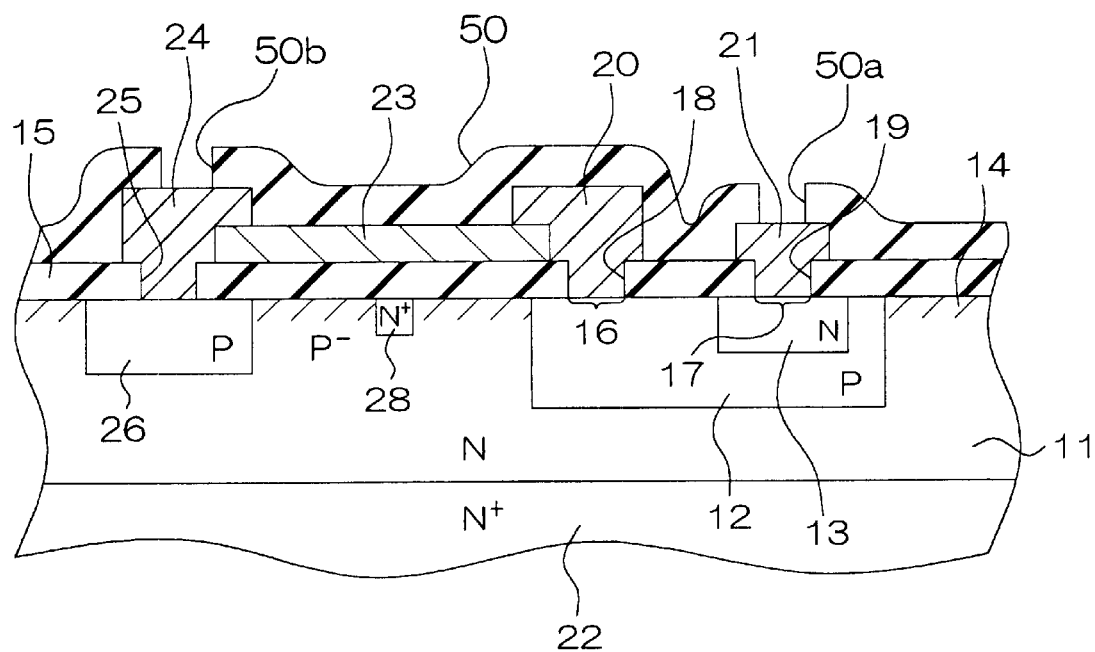
FIG. 1 is a section view illustrating the arrangement of a semiconductor device having a resistor-incorporating bipolar transistor according to an embodiment of the present invention.

FIG. 1 is a section view illustrating the arrangement of a semiconductor device having a resistor-incorporating bipolar transistor according to an embodiment of the present invention. A P-type base area 12 is formed at the side of the surface of an N-type semiconductor substrate 11. An N-type emitter area 13 is formed in this P-type base area 12. This forms an NPN structure, and the N-type semiconductor substrate 11 forms a collector area. P-type impurity is diffused in a low concentration to the surface of the N-type collector area 11 to form a P$^-$-type diffusion layer 14 on the whole surface of the N-type collector area 11.

The surface of the semiconductor substrate 11 is covered with an insulating film 15 made of silicon oxide for example. Formed in the insulating film 15 are contact holes 18, 19 to which there are respectively exposed a base contact area 16 defined on the surface of the base area 12 and an emitter contact area 17 defined at the emitter area 13. A base electrode 20 is so formed as to be connected to the base contact area 16 through the contact hole 18. An emitter electrode 21 is so formed as to be connected to the emitter contact area 17 through the contact hole 19. Each of the base electrode 20 and the emitter electrode 21 is made of a conductive material such as aluminium or the like. A collector electrode (not shown) is bonded to an N$^+$-type area 22 formed at the underside of the N-type semiconductor substrate 11.

Disposed on the insulating film 15 is a long-size or strip-shaped surface resistor 23 made of polysilicon for example. The length of the surface resistor 23 is for example 5000 Å. The surface resistor 23 is connected at one end thereof to the base electrode 20 raised on the contact hole 18. The other end of the surface resistor 23 is connected to a base pad 24 which is made of aluminium for example and which is formed in a raised manner on the insulating film 15. The uppermost surface of this semiconductor device is covered with a surface protective film 50. Portions of the emitter electrode 21 and the base pad 24 are respectively exposed through openings 50a, 50b formed in the surface protective film 50.

The base pad 24 is also connected to the collector area 11 through a contact hole 25 formed in the insulating film 15. At that part of the collector area 11 which is joined to the base pad 24, there is formed a P-type impurity area 26 higher in impurity concentration than the P$^-$-type diffusion layer 14. Thus, there is formed a PN junction between the P-type impurity area 26 and the N-type collector area 11, to form a parasite Zener diode 27 between the base pad 24 and the collector area 11 as shown in an equivalent circuit in FIG. 2.

Figure 2:
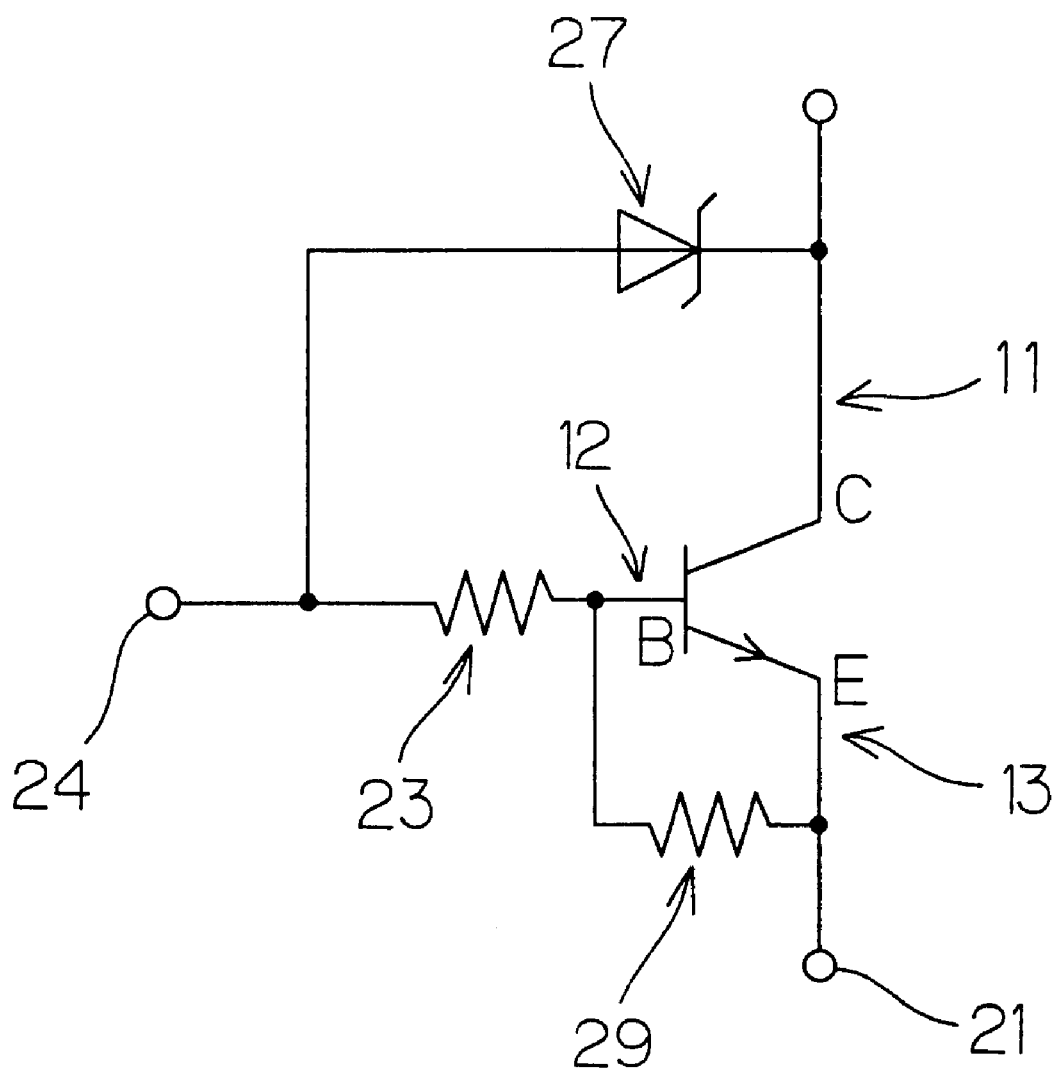
FIG. 2 is a view of an equivalent circuit of the semiconductor device in FIG. 1.

Between the base area 12 and the P-type impurity area 26, an N$^+$-type isolation area 28 is formed to separate these areas from each other. As shown in FIG. 2, a resistor 29 made of polysilicon for example is interposed between the base electrode and the emitter electrode 21. This resistor 29 is not shown in FIG. 1.

According to the arrangement above-mentioned, even though a forward surge voltage is applied across the base and the emitter, a portion of a forward current entered into the base pad 24 from a base wire (not shown) escapes to the collector area 11 through the parasite Zener diode 27. This prevents an overcurrent from flowing in the surface resistor 23. This in turn prevents the surface resistor 23 from being burnt due to the flow of an overcurrent therein.

When a reverse surge voltage not less than the breakdown voltage of the parasite Zener diode 27 is applied across the base and the emitter, there occurs a breakdown phenomenon of the parasite Zener diode 27, causing a leak current to flow from the collector area 11 to the base pad 24. This prevents a leak current from flowing into the insulating film 15. This in turn prevents the insulating film 15 from presenting a spot-like breakdown due to a leak current.

Further, the parasite Zener diode 27 is formed in the collector area 11 at its portion connected to the base pad 24. Thus, there is no possibility of the semiconductor device being increased in size due to the provision of the parasite Zener diode 27.

Figure 3:
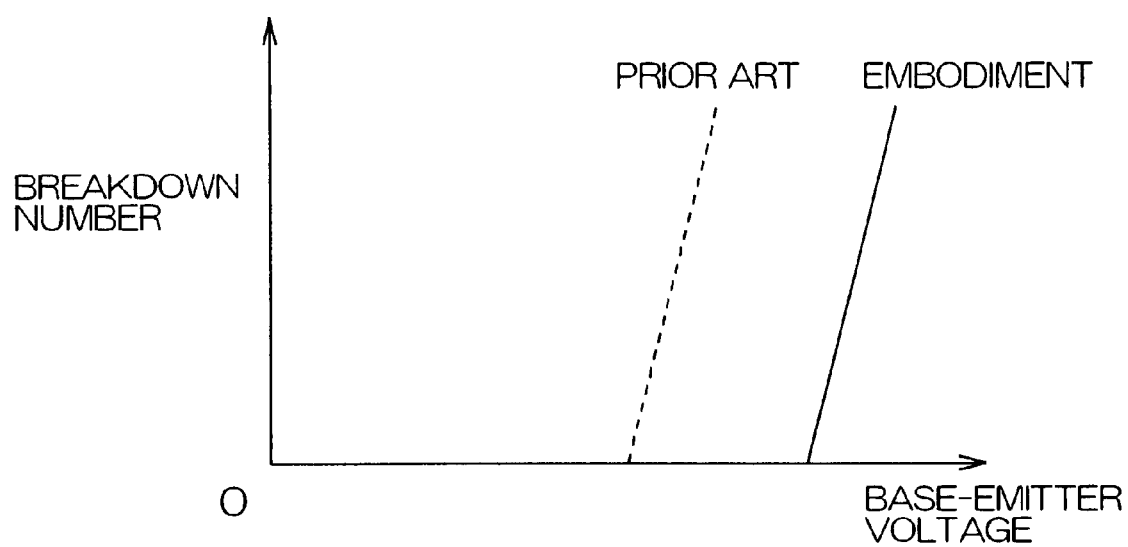
FIG. 3 is a view illustrating the results of the electrostatic destructive inspections respectively conducted on resistor-incorporating transistors of the embodiment of the present invention and resistor-incorporating transistors of prior art.

FIG. 3 is a view illustrating the results of the electrostatic destructive inspections respectively conducted on resistor-incorporating transistors of the embodiment of the present invention and on resistor incorporating transistors of prior art.

The electrostatic destructive inspections were conducted in the following manner. A voltage was applied to each capacitor (e.g., 200 pF) connected to each base electrode through a resistor (e.g., 1 KΩ) to accumulate the electric charge. Then, the electric charge thus accumulated in each capacitor was discharged, causing an electric current to flow across collector and base and across base and emitter. At this time, there was counted the number of broken transistors. As the results of the electrostatic destructive inspections, FIG. 3 shows the relationships between the voltage across base and emitter (capacitor applied voltage) and the number of broken transistors (breakdown number). In FIG. 3, the solid line shows the result of the bipolar transistors of the present invention, while the broken line shows the result of the bipolar transistors of prior art.

It is understood from the results of the electrostatic destructive inspections that the lowest base-emitter voltage (breakdown voltage) at which a bipolar transistor of the present invention began to be electrostatically broken, is about 1.5 times the breakdown voltage for a resistor-incorporating transistor of prior art. It is thus understood that the resistor-incorporating transistor of the present invention is improved in breakdown resistibility as compared with the resistor-incorporating transistor of prior art.

FIG. 4(a) to FIG. 4(f) are section views illustrating successive steps of a method of producing a semiconductor device having a resistor-incorporating transistor according to the embodiment of the present invention. First, as shown in FIG. 4(a), the surface of an N-type semiconductor substrate 11 provided at the underside thereof with an N$^+$-type area 22, is thermally oxidized to form a silicon oxide film 30. P-type impurity (e.g., boron) is diffused in a low concentration from the surface of the silicon oxide film 30 to form a P$^-$-type diffusion layer 14 on the whole surface of the semiconductor substrate 11.

Then, as shown in FIG. 4(b), recess portions 31, 32 are formed in the silicon oxide film 30 at respective positions corresponding to a base area 12 and a P-type impurity area 26. P-type impurity (e.g., boron) is diffused in a high concentration from the recess portions 31, 32 to form the base area 12 and the P-type impurity area 26 respectively.

As shown in FIG. 4(c), a recess portion 33 is then formed in the recess portion 31 in the silicon oxide film 30 at a position corresponding to an emitter area 13, the bottom of the recess portion 33 being lower than the bottom of the recess portion 31, and a recess portion 34 is formed in the silicon oxide film 30 at a position corresponding to an isolation area 28. N-type impurity (e.g., phosphorus) is diffused in a high concentration from the recess portions 33, 34 to form the emitter area 13 and the isolation area 28.

As shown in FIG. 4(d), the silicon oxide film 30 is then removed, causing the surface of the semiconductor substrate 11 to be exposed to the outside, and an insulating film 15 is formed on the semiconductor substrate 11 thus exposed. Then, a surface resistor 23 made of polysilicon for example is pattern-formed.

As shown in FIG. 4(e), contact holes 18, 19, 25 are then formed by a photolithography technique. As shown in FIG. 4(f), a base electrode 20 and a base pad 24 are respectively connected to the base area 12 and the P-type impurity area 26 through the contact holes 18, 25, and are also connected to the surface resistor 23. Further, an emitter electrode 21 is so formed as to be connected to the emitter area 13 through the contact hole 19. Then, a surface protective film 50 is formed on the uppermost surface of the semiconductor substrate 11, and there are formed, in the surface protective film 50, openings 50a, 50b, through which portions of the surfaces of the emitter electrode 21 and the base pad 24 are exposed. There is thus achieved a semiconductor device having a resistor-incorporating transistor according to the embodiment of the present invention.

The foregoing has discussed an embodiment of the present invention, but it is a matter of course that the present invention maybe embodied in other manner. For example, the surface resistor is made of polysilicon film in the embodiment above-mentioned, but the surface resistor may be made of other material than polysilicon, such as tantalum nitride (TaN).

In the above embodiment, an NPN-type bipolar transistor has been taken as an example, but the present invention may also be applied to a PNP-type bipolar transistor. In this case, an N-type area may be formed in a P-type collector area at its part joined to the base pad, thus forming a PN junction by this N-type area and the P-type collector area.

In the above embodiment, a semiconductor device having a single bipolar transistor has been discussed as an example. However, the present invention may also be applied to a semiconductor device having a plurality of bipolar transistors, semiconductor device such as an IC (integrated circuit) having, on the same semiconductor substrate, a plurality of functional elements other than bipolar transistors.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application corresponds to Japanese Patent Application Serial No. 11-267677 filed on Sep. 21st, 1999, the entire disclosure of which is incorporated herein by reference.

I claim:

1. A semiconductor device, comprising:
   a semiconductor substrate having a flat surface with a diffusion layer of a first conduction type diffusing into the semiconductor substrate through the flat surface, the semiconductor substrate being of a second conduction type forming a collector area;
   a base area of the first conduction type formed into the flat surface of the semiconductor substrate to a depth below the diffusion layer;
   an emitter area of a second condition type formed into said base area;
   an impurity area of the first conduction type formed into the flat surface of the semiconductor substrate to a depth below the diffusion layer and being separated from said base area;
   a base electrode connected to said base area;
   a base pad connected to said said impurity area; and
   a surface resistor spaced apart from the flat surface of the semiconductor substrate and extending to and between the base electrode and the base pad for electrical connection therebetween.

2. A semiconductor device according to claim 1, wherein said collector area and said impurity area form a Zener diode.

3. A semiconductor device according to any claim 1, further comprising an isolation area between said base area and said impurity area for separating these areas from each other.

4. A semiconductor device producing method comprising the steps of:
   providing a semiconductor substrate having a flat surface with a diffusion layer of a first conduction type diffusing into the semiconductor substrate through the flat surface, the semiconductor substrate being of a second conduction type forming a collector area;
   forming a base area of the first conduction type into the flat surface of the semiconductor substrate to a depth below the diffusion layer;
   forming an emitter area of a second condition type formed into said base area;
   forming an impurity area of the first conduction type into the flat surface of the semiconductor substrate to a depth below the diffusion layer, the impurity area being separated from said base area;
   providing a base electrode and connecting the base electrode to said base area;
   providing a base pad and connecting the base pad said impurity area; and
   providing a surface resistor spaced apart from the flat surface of the semiconductor substrate and extending to and between the base electrode and the base pad for electrical connection therebetween.

5. A semiconductor device producing method according to claim 4, wherein a Zener diode is formed by joining said semiconductor substrate and said impurity area to each other.

6. A semiconductor device producing method according to claim 4, further comprising a step of forming an isolation area of the second conduction type between said base area and said impurity area for separating these areas from each other.

7. A semiconductor device according to claim 1, wherein the base area forms a base contact area, the emitter area forms an emitter contact area, the impurity area forms an impurity contact area, the base contact area, the emitter contact area, the impurity contact area and the flat surface of the semiconductor substrate being coexistent in a common plane.

8. A semiconductor device according to claim 1, wherein the base electrode connected to the base area projects away from the flat surface of the semiconductor substrate and the base pad connected to the impurity area projects away from the flat surface of the semiconductor substrate.

9. A semiconductor device according to claim 1, further comprising an emitter electrode connected to the emitter area and projecting away from the flat surface of the semiconductor substrate.

10. A semiconductor device according to claim 3, further comprising an insulating film disposed between and in contact with the isolation area and the surface resistor and disposed between and in contact with the base electrode and the base pad.

* * * * *